United States Patent
Fujii et al.

(10) Patent No.: US 7,717,317 B2
(45) Date of Patent: May 18, 2010

(54) BALL CAPTURING APPARATUS, SOLDER BALL DISPOSING APPARATUS, BALL CAPTURING METHOD, AND SOLDER BALL DISPOSING METHOD

(75) Inventors: Masanao Fujii, Kawasaki (JP); Toru Okada, Kawasaki (JP); Yutaka Noda, Kawasaki (JP); Ryoji Matsuyama, Kawasaki (JP); Hidehiko Kobayashi, Kawasaki (JP); Hisao Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 195 days.

(21) Appl. No.: 11/864,600

(22) Filed: Sep. 28, 2007

(65) Prior Publication Data
US 2008/0020561 A1 Jan. 24, 2008

Related U.S. Application Data

(63) Continuation of application No. PCT/JP2005/006099, filed on Mar. 30, 2005.

(51) Int. Cl.
*B23K 31/02* (2006.01)
*B23K 37/00* (2006.01)
(52) U.S. Cl. .......................... 228/246; 228/41
(58) Field of Classification Search ................. None
See application file for complete search history.

(56) References Cited

U.S. PATENT DOCUMENTS

| | | | | |
|---|---|---|---|---|
| 5,088,639 | A * | 2/1992 | Gondotra et al. | 228/180.1 |
| 5,626,277 | A * | 5/1997 | Kawada | 228/41 |
| 6,065,201 | A * | 5/2000 | Sakai | 29/430 |
| 6,460,755 | B1 | 10/2002 | Inoue et al. | |
| 6,533,159 | B1 * | 3/2003 | Cobbley et al. | 228/20.1 |
| 6,541,364 | B2 * | 4/2003 | Mukuno et al. | 438/612 |

(Continued)

FOREIGN PATENT DOCUMENTS

JP 7-307340 A 11/1995

(Continued)

OTHER PUBLICATIONS

Translation of the International Preliminary Report on Patentability of International Application No. PCT/JP 2005/006099, with Form PCT/IB/373 and Form PCT/ISA/237.

(Continued)

*Primary Examiner*—Kiley Stoner
(74) *Attorney, Agent, or Firm*—Fujitsu Patent Center

(57) ABSTRACT

The present invention relates to a ball capturing apparatus and method of capturing one ball from plural balls having the same size, and to a solder ball disposing apparatus and method of disposing a solder ball containing solder in a predetermined position on a circuit board, thereby reliably capturing one ball from the plural balls having the same size. The apparatus includes: a holding member 111 including a holding wall 111a air-tightly closing a space S that holds a plurality of balls B having the same size and in which a hole 1111 larger than a size of one ball and smaller than a size of two balls is formed in an upper part of the holding wall; blowup means 112 for blowing the balls B held in the holding member 111 upward; and capturing means 12 for capturing a ball B blown up by the blowup means 112 and reached the hole.

19 Claims, 6 Drawing Sheets

U.S. PATENT DOCUMENTS

| | | | |
|---|---|---|---|
| 6,742,694 B2 * | 6/2004 | Satoh et al. | 228/41 |
| 7,458,499 B2 * | 12/2008 | Ng et al. | 228/246 |
| 2002/0113115 A1 * | 8/2002 | Satoh et al. | 228/41 |
| 2004/0094601 A1 * | 5/2004 | Hazeyama et al. | 228/41 |
| 2005/0045701 A1 * | 3/2005 | Shindo et al. | 228/246 |
| 2006/0027624 A1 * | 2/2006 | Cobbley et al. | 228/20.1 |
| 2007/0123068 A1 * | 5/2007 | Niizuma | 439/70 |
| 2008/0032495 A1 * | 2/2008 | Shimokawa et al. | 438/613 |

FOREIGN PATENT DOCUMENTS

| | | | |
|---|---|---|---|
| JP | 408264930 A * | 10/1996 | |
| JP | 9-18130 A | 1/1997 | |
| JP | 409018130 A * | 1/1997 | |
| JP | 9-298356 A | 11/1997 | |
| JP | 411026925 A * | 1/1999 | |
| JP | 11-284003 A | 10/1999 | |
| JP | 2000-68312 A | 3/2000 | |
| JP | 2001-44624 A | 2/2001 | |
| JP | 2001-68840 A | 3/2001 | |
| JP | 2004-23028 A | 1/2004 | |
| JP | 2005079492 A * | 3/2005 | |
| JP | 2006-289472 A * | 10/2006 | |

OTHER PUBLICATIONS

Chinese Office Action dated Mar. 20, 2009, issued in corresponding Chinese Patent Application No. 200580049258X.

International Search Report of PCT/JP2005/006099, date of mailing May 31, 2005.

* cited by examiner

BALL CAPTURING APPARATUS, SOLDER BALL DISPOSING APPARATUS, BALL CAPTURING METHOD, AND SOLDER BALL DISPOSING METHOD

TECHNICAL FIELD

The present invention relates to a ball capturing apparatus and method of capturing one ball from plural balls having the same size and a solder ball disposing apparatus and method of disposing a solder ball containing solder in a predetermined position on a circuit board.

BACKGROUND ART

The smaller a ball is, the more it is difficult to capture one ball from plural balls having the same size. For example, in the case of disposing a solder ball obtained by covering a copper ball with solder between an electrode provided at the tip of a flexible flat capable (FPC) and a pad of a circuit board, a solder ball having a diameter of about 0.15 mm to 0.2 mm is used. It is difficult to capture such a solder ball having small diameter from a number of solder balls.

A technique of forming solder balls in a lump on pads on a circuit board by using a mask or the like can be considered. However, at the time of trial manufacture or repair or in the case in which pads exist in a position where a mask cannot be disposed, solder balls cannot be formed in a lump by using a mask and thus, one solder ball is captured from a number of solder balls, and solder balls are disposed on the pads on the circuit board one by one.

Some apparatuses for blowing up a number of solder balls and sucking air to thereby capture the blown solder balls have been proposed (refer to, for example, Japanese Patent Application Laid-open Nos. 7-307340, 2001-44624, and 9-18130 and Japanese Patent No. 3440836).

DISCLOSURE OF THE INVENTION

Problem to be Solved by the Invention

The apparatuses disclosed in the above-mentioned patent documents, however, have been achieved on precondition that plural solder balls are captured in a lump, and cannot capture only one solder ball due to static electricity acting between solder balls and leakage of air at the time of sucking.

In view of the circumstances, an object of the present invention is to provide a ball capturing apparatus and method capable of reliably capturing one ball from plural balls having the same size and a solder ball disposing apparatus and method of disposing a solder ball containing solder in a predetermined position on a circuit board by using the ball capturing apparatus.

Solution to the Problem

A ball capturing apparatus of the present invention for achieving the object includes: a holding member including a holding wall air-tightly closing a space that holds a plurality of balls having the same size and in which a hole larger than a size of one ball and smaller than a size of two balls is formed in an upper part of the holding wall;
blowup means that blows the balls held in the holding member upward; and
capturing means that captures a ball blown up by the blowup means and reached the hole.

To achieve the object, the invention also provides a solder ball disposing apparatus of disposing a solder ball containing solder in a predetermined position on a circuit board, including:
a holding member including a holding wall air-tightly closing a space that holds a plurality of solder balls having the same size and in which a hole larger than a size of one solder ball and smaller than a size of two solder balls is formed in an upper part of the holding wall;
blow up means that blows the solder balls held in the holding member upward;
capturing means that captures a solder ball blown up by the blowup means and reached the hole; and
a disposing mechanism for aligning position of the solder ball captured by the capturing means with the predetermined position in the circuit board and disposing the solder ball in the predetermined position.

With the apparatuses of the invention, even if balls or solder balls (hereinbelow, generically called balls) are attracted by each other by electrostatic force, the balls are separated from each other by being blown by the blowup means. Since the number of balls which can pass through the hole is one, one ball can be reliably captured from balls having the same size.

Moreover, even in the case where the capturing means captures the ball reaching the hole by suction, the same sucking action does not simultaneously work on two balls because of the size of the hole, and one ball can be reliably captured.

Preferably, the capturing means has a passage in which sucked air flows and a flowmeter that measures flow rate of air flowing in the passage, and
the ball capturing apparatus or the solder ball capturing apparatus has a detector that detects that the capturing means captures the ball in accordance with a change in the flow rate measured by the flowmeter.

When the inside diameter of the suction opening in the capturing means is large to some extent, capture (suction) of a ball by the capturing means can be detected according to a change in the pressure in the passage. However, the smaller a ball is, the smaller the inside diameter of the suction opening in the capturing means becomes, and thus it is difficult to detect the capture (suction). When attention is paid to a change in the flow rate of air passing in the passage, even if the inside diameter of the suction opening in the capturing means is small, capture (suction) of a ball can be easily detected.

The blowup means may blow fluid from a round opening into the holding member but, preferably, blows fluid from a slit-shaped opening.

In the case where the blowup means blows fluid from a round opening, when the blowing of the fluid is stopped, balls lie around the round opening as a center while avoiding the opening. When the fluid is blown in this state, it may take time until a ball reaches the hole. On the other hand, with the slit-shaped opening, when the blowing of the fluid is stopped, a ball exists on the opening so as to close the slit-shaped opening. When the fluid is blown in this state, time for a ball to reach the hole is shortened, and the capturing efficiency improves.

Preferably, the blowup means blows fluid into the holding member, and has: a passage in which the fluid flows; and depressure means provided in some midpoint of the passage and making a part of pressure in the passage escape to the outside.

While stopping the blowing of the fluid, unintended pressure may be applied in the passage by chance to blow the balls held in the holding member upward and some balls may jump out from the hole. With the above-described preferable feature, even if unintended pressure is applied in the passage, the unintended pressure is escaped by the depressure means.

A first ball capturing method of achieving the object includes:

an aligning step of aligning capturing means that captures a ball with a hole formed in an upper part of a holding wall air-tightly closing a space that holds a plurality of balls having the same size, the hole being larger than a size of one ball and smaller than a size of two balls;

a capturing step of blowing the balls held in the holding member upward and capturing a ball blown up and reached the hole by the capturing means; and a stopping step of stopping blowup of the balls.

The present invention for achieving the object also provides a first solder ball disposing method of disposing a solder ball containing solder in a predetermined position on a circuit board, including:

an aligning step of aligning capturing means that captures a solder ball with a hole formed in an upper part of a holding wall air-tightly closing a space that holds a plurality of solder balls having the same size, the hole being larger than a size of one solder ball and smaller than a size of two solder balls;

a capturing step of blowing up the solder balls held in the space and capturing a solder ball blown up and reached the hole by the capturing means;

a stopping step of stopping blowup of the solder balls; and a disposing step of disposing the solder ball captured by the capturing means in the predetermined position on the circuit board.

According to the first methods of the invention, even if balls are attracted by each other by electrostatic force, the balls are separated from each other by being blown by the blowup means. Since the number of balls which can pass through the hole is one, one ball can be reliably captured from balls having the same size.

In the first methods of the invention, while blowing of the balls is stopped, it is preferable to draw the balls held in the holding member to a lower place.

Even if unintended force of blowing the balls held in the holding member upward acts by chance during stop of the blowing of the balls, since the balls held in the space are drawn to a lower place, the balls are prevented from jumping out from the hole.

The capturing step is also preferable to be a step of blowing up the balls held in the space by blowing fluid from a slit-shaped opening into the space.

With this additional feature, the time required for a ball to reach the hole is shortened, and the capturing efficiency improves.

A second ball capturing method of the invention for achieving the object includes:

an aligning step of aligning capturing means that captures a ball by suction with a hole formed in an upper part of a holding wall air-tightly closing a space that holds a plurality of balls having the same size, the hole being larger than a size of one ball and smaller than a size of two balls;

a suction starting step of starting sucking operation of the capturing means aligned with the hole;

a capturing step of blowing up the balls held in the space and sucking and capturing a ball blown up and reached the hole by the capturing means; and a stopping step of stopping blowup of the balls.

The invention for achieving the object also provides a second solder ball disposing method of disposing a solder ball containing solder in a predetermined position on a circuit board, including:

an aligning step of aligning capturing means that captures a ball by suction with a hole formed in an upper part of a holding wall air-tightly closing a space that holds a plurality of balls having the same size, the hole being larger than a size of one ball and smaller than a size of two balls;

a suction starting step of starting sucking operation of the capturing means aligned with the hole;

a capturing step of blowing up the solder balls held in the space and sucking and capturing a solder ball blown up and reached the hole by the capturing means;

a stopping step of stopping blowup of the solder balls; and a disposing step of aligning position of the solder ball captured by the capturing means with the predetermined position on the circuit board, and then, stopping the sucking operation of the capturing means and disposing the solder ball captured by the capturing means to the predetermined position.

According to the second methods of the invention, the same sucking action of the capturing means does not simultaneously work on two balls because of the size of the hole, and one ball can be reliably captured.

Preferably, the stopping step is a step of stopping blowup of the balls and drawing the balls to a lower place by a suction force weaker than a suction force of the capturing means, and in the second solder ball disposing methods, preferably, the disposing step is a step executed after the stopping step is performed.

By executing the disposing step after the stopping step, even when other balls are attached to the ball reaching the hole by electrostatic force, the other balls are separated from the ball reaching the hole by the action of the suction force weaker than the suction force of the capturing means. Thus, one ball can be captured from plural balls having the same size more reliably, and can be disposed in a predetermined position on a circuit board.

The stopping step is preferably a step of stopping blowup of the balls when flow rate of air in a passage in which the air sucked by the capturing means flows becomes lower than predetermined flow rate.

When the capturing means sucks a ball, the flow rate of air flowing in the passage becomes lower than predetermined flow rate. Consequently, the stopping step is executed after the capturing means captures a ball. Thus, one ball can be captured more reliably from plural balls having the same size.

Effect of the Invention

The present invention can provide a ball capturing apparatus and method capable of capturing one ball from plural balls having the same size and a solder ball disposing apparatus and method of disposing a solder ball containing solder in a predetermined position on a circuit board by using the ball capturing apparatus.

BEST MODE FOR CARRYING OUT THE INVENTION

Embodiments of the invention will be described hereinbelow with reference to the drawings.

Figure 1:
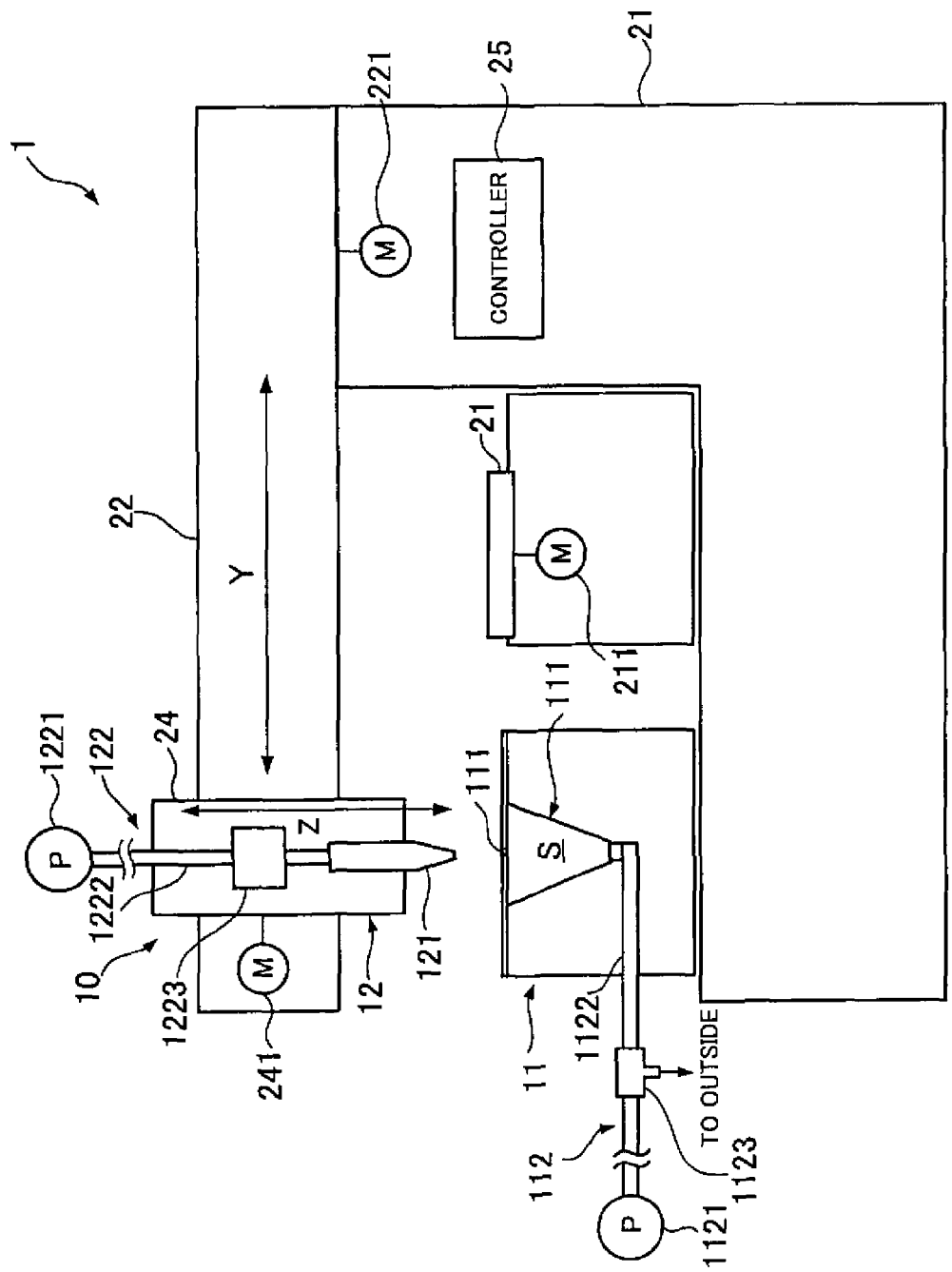
FIG. 1 is a diagram showing a schematic configuration of an apparatus corresponding to an embodiment of the solder ball disposing apparatus of the present invention.

FIG. 1 is a diagram showing a schematic configuration of an apparatus corresponding to an embodiment of the solder ball disposing apparatus of the invention.

A solder ball disposing apparatus 1 shown in FIG. 1 is an apparatus for disposing solder balls onto plural pads provided on the surface of a circuit board one by one. The solder ball is a small ball having a diameter of 0.15 mm and obtained by coating a copper ball with solder. In the following description, the direction perpendicular to the drawing sheet of FIG. 1 is set as an X-axis direction, the lateral direction is set as a Y-axis direction, and a vertical direction is set as a Z-axis direction. The solder ball disposing apparatus 1 has a base 21, an X-axis direction positioning stage 22, a Y-axis direction positioning stage 23, and a Z-axis direction positioning stage 24.

In the solder ball disposing apparatus 1 shown in FIG. 1, a solder ball capturing apparatus 10 corresponding to an embodiment of the ball capturing apparatus of the present invention is assembled. The solder ball capturing apparatus 10 has a ball supply unit 11 and a hand unit 12.

The ball supply unit 11 has a holding member 111 for holding solder balls having the same size. The holding member 11 has a funnel shape whose upper opening is closed with a plate member in which a supply hole 1111 having a diameter larger than 0.15 mm and smaller than 0.30 mm is formed in the center. Specifically, the holding member 11 shown in FIG. 1 has the supply hole 1111 larger than the size of one solder ball and smaller than the size of two solder balls. The supply hole 1111 is formed in the upper part of the holding wall air-tightly closing a space S that stores plural balls having the same size. The holding member 111 is fixed to the base 21 of the solder ball disposing apparatus 1. The ball supply unit 11 also has a blow-up mechanism 112. The blow-up mechanism 112 has a pump 1121 and a pipe 1122 whose one end is connected to the pump 1121. The other end of the pipe 1122 is connected to the bottom of the holding member 111. Air compressed or sucked by the pump 1121 flows in the pipe 1122. When the compressed air flows in the pipe 1122, the air blows upward from the bottom of the holding member 111. The blow-up mechanism 112 has a T branch 1123. The T branch 1123 is provided in some midpoint of the pipe 1122 and has a passage branched from a passage to the pump 1121, connected to the outside, and acting as a restrictor. The T branch 1123 is provided to let a part of pressure in the pipe 1122 escape to the outside. The passage acting as a restrictor is provided with a check valve.

The hand unit 12 has a capillary 121 and a suction mechanism 122. The capillary 121 is attached to the Z-axis positioning stage 24 in a posture such that its tip faces the supply hole 1111 in the holding member 111. When a motor 241 rotates, the Z-axis positioning stage 24 moves in the Z axis direction (see the arrow Z in the diagram), that is, in the vertical direction. In the solder ball disposing apparatus 1, the position of the tip of the capillary 121 and the position of the supply hole 1111 in the holding member 111 are always aligned in the X axis direction. FIG. 1 shows a state where the Z-axis positioning stage 24 rises and the tip of the capillary 121 is largely apart from the supply hole 1111 in the holding member 111. When the Z-axis positioning stage 24 descends, the tip of the capillary 121 moves to a position above the supply hole 1111 in the holding member 111 by about 0.075 mm which corresponds to the radius of a solder ball (herein below, the position will be called a suction position). Further, the Z-axis positioning stage 24 is attached to the Y-axis positioning stage 22 so as to be movable in the Y-axis direction (see the arrow Y in the diagram). When a motor 221 rotates, the Z-axis positioning stage 24 moves along the Y-axis positioning stage 22. The suction mechanism 122 as a component of the hand unit 12 has a pump 1221 and a pipe 1222 whose one end is connected to the pump 1221. When the pump 1221 is driven, air is sucked from the tip of the capillary 121 and sucking operation is performed. The other end of the pipe 1222 is connected to the rear end of the capillary 121. To the pipe 1222, air sucked from the tip of the capillary 121 flows. The suction mechanism 122 also has a flowmeter 123. The flowmeter 123 measures the flow rate of air flowing in the pipe 1222.

In the solder ball disposing apparatus 1 shown in FIG. 1, the X-axis positioning stage 21 is provided in a position apart from the holding member 111 in the Y axis direction. A circuit board is mounted on the X-axis positioning stage 21. When a motor 211 rotates, the X-axis positioning stage 21 moves in the X axis direction (the direction perpendicular to the drawing sheet face).

The solder ball disposing apparatus 1 shown in FIG. 1 11 has a controller 25. The controller 25 performs control on the whole solder ball disposing apparatus and also performs control on the solder ball capturing apparatus.

Figure 2:
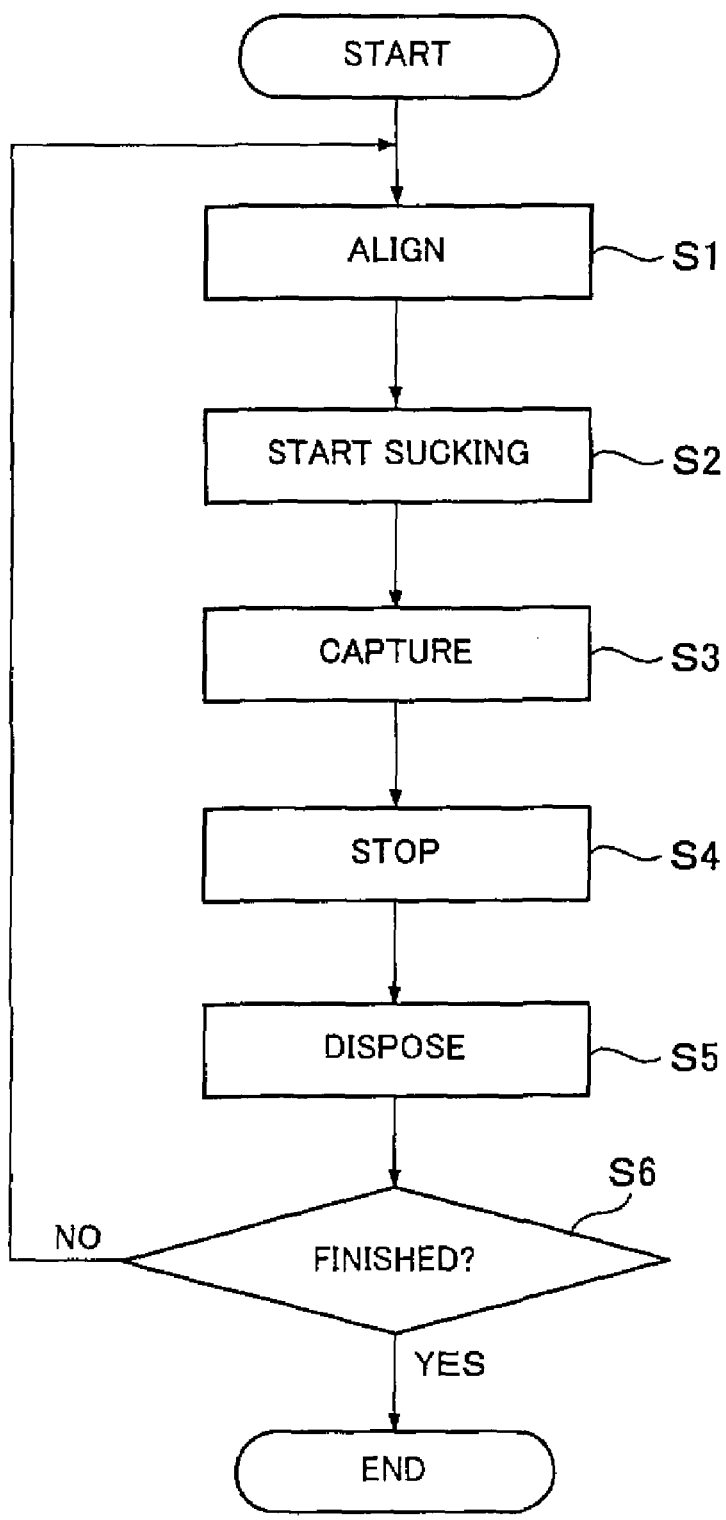
FIG. 2 is a flowchart showing a solder ball arranging method carried out by the solder ball disposing apparatus illustrated in FIG. 1.

FIG. 2 is a flowchart showing a solder ball arranging method executed by the solder ball disposing apparatus illustrated in FIG. 1.

As a preparation, plural solder balls each having a diameter of 0.15 mm are housed in the holding member 111 shown in FIG. 1. The pump 1121 in the blow-up mechanism 112 is allowed to perform the sucking operation to achieve a state where air is sucked from the supply hole 1111 in the holding member 111. In this state, a solder ball is put one by one on the supply hole 1111 and is sucked into the holding member 111. A circuit board on which pads are provided is put on the X-axis positioning stage 21 shown in FIG. 1.

After the preparation, the solder ball arranging method is executed. First, the supply hole 1111 in the holding member 111 in which the solder balls are held and the tip of the capillary 121 are aligned (step S1). Specifically, by moving the Z-axis positioning stage 24 in the Y-axis direction in a state where the tip of the capillary 121 and the supply hole 1111 in the holding member 111 are aligned in the X-axis direction, the tip of the capillary 121 and the supply hole 1111 in the holding member 111 are aligned in the Y axis direction. After that, the Z-axis positioning stage 24 is moved in the Z axis direction, thereby moving the tip of the capillary 121 to the suction position. It is also possible to fix the position of the tip of the capillary 121 and move the holding member 111 in the Y-axis direction and the Z-axis direction to aligning the supply hole 1111 in the holding member 111 and the tip of the capillary 121.

Subsequently, the pump 1221 in the suction mechanism 122 is driven in a state where the tip of the capillary 121 is in the suction position to start the sucking operation of sucking air from the tip of the capillary 121 (step S2).

Next, the pump 1121 in the blow-up mechanism 112 is allowed to perform compressing operation and compressed air is sent to the pipe 112 (step S3). It makes the air blown upward from the bottom of the holding member 111, the solder balls held in the holding member 111 are lifted by the air, and a solder ball blown up and reached the supply hole 1111 is attracted by the tip of the capillary 121 and is captured. That is, in step S3, solder balls held in the holding member 111 are blown up, and a solder ball blown up and reached the supply hole 1111 is sucked by the capillary 121, thereby the solder ball is captured.

Subsequently, the compressing operation of the pump 1121 in the blow-up mechanism 112 is stopped and the pump 1121 is allowed to perform the sucking operation (step S4). The sucking operation of the pump 1121 in the blow-up mechanism 112 is an operation of generating a suction force weaker than the suction force generated by the pump 1221 in the suction mechanism 122. The pump 1221 in the suction mechanism 122 performs the sucking operation continuously since step S2. Consequently, the solder balls blown up by the air lifted from the bottom of the holding member 111 are attracted to the bottom side and drop. However, the solder ball attracted by the tip of the capillary 121 remains attracted by the tip of the capillary 121 by the suction force of the pump 1221 in the suction mechanism 122.

The solder ball attracted by the tip of the capillary 121 is disposed onto a desired pad provided on the surface of the circuit board (step S5). Specifically, while driving the pump 1221 in the suction mechanism 122, the Z-axis positioning stage 24 is lifted. After that, the Z-axis positioning stage 24 is moved in the Y axis direction. First, with respect to the Y axis direction, the position of a desired pad out of the plural pads on the surface of the circuit board mounted on the X-axis positioning stage 21 and the position of the solder ball attracted by the tip of the capillary 121 are aligned. Subsequently, the X-axis positioning stage 21 is moved to the X-axis direction (the direction perpendicular to the drawing sheet face of FIG. 1), and the position of the desired pad and the position of the solder ball are aligned in the X axis direction. After that, the Z-axis positioning stage 24 is allowed to descend to put the solder ball sucked at the tip of the capillary 121 onto the desired pad provided on the surface of the circuit board. Finally, the driving of the pump 1221 in the suction mechanism 122 is stopped, and the solder ball sucked at the tip of the capillary 121 is put onto the desired pad provided on the surface of the circuit board.

After that, the Z-axis positioning stage 24 is raised. When arrangement of a solder ball to the remaining pad(s) is necessary, the routine returns to step S1, and if the arrangement is unnecessary, the routine is finished (step S6).

When the flowchart is finished or the routine returns to the step Si, the sucking operation of the pump 1121 in the blow-up mechanism 112 executed in the step S4 is continuously performed to draw the solder balls held in the holding member 111 to the bottom until step S3 begins. By such operation, even if an unintended force of lifting up the solder balls acts on the solder balls held in the holding member 111, since the solder balls held in the holding member 111 are drawn to a lower place, the solder balls are prevented from Jumping out from the supply hole 1111. In addition, the T branch 1123 is provided in some midpoint of the pipe 1122 in the blow-up mechanism 112 as shown in FIG. 1. Consequently, even when unintended compressed air is sent into the pipe 1122 by chance, the unintended compressed air escapes to the outside via the passage acing as the restrictor communicated with the outside in the T branch 1123. It can also suppress jump-out of the solder balls from the supply hole 1111.

The flowmeter 1223 shown in FIG. 1 will now be described in detail.

When the inside diameter of the capillary is large to some extent, it can be detected that the capillary 121 sucks a solder ball by a change in the pressure in the pipe 1222 in the suction mechanism 122. The smaller a solder ball becomes, the smaller the inside diameter of the capillary 121 becomes, and the more it becomes difficult to detect the suction. Consequently, in the solder ball disposing apparatus 1 shown in FIG. 1 handling very small solder balls each having a diameter of 0.15 mm, suction of a solder ball by the capillary 121 is detected on the basis of a change in the flow rate of air flowing in the pipe 1222 in the suction mechanism 122.

Figure 3:
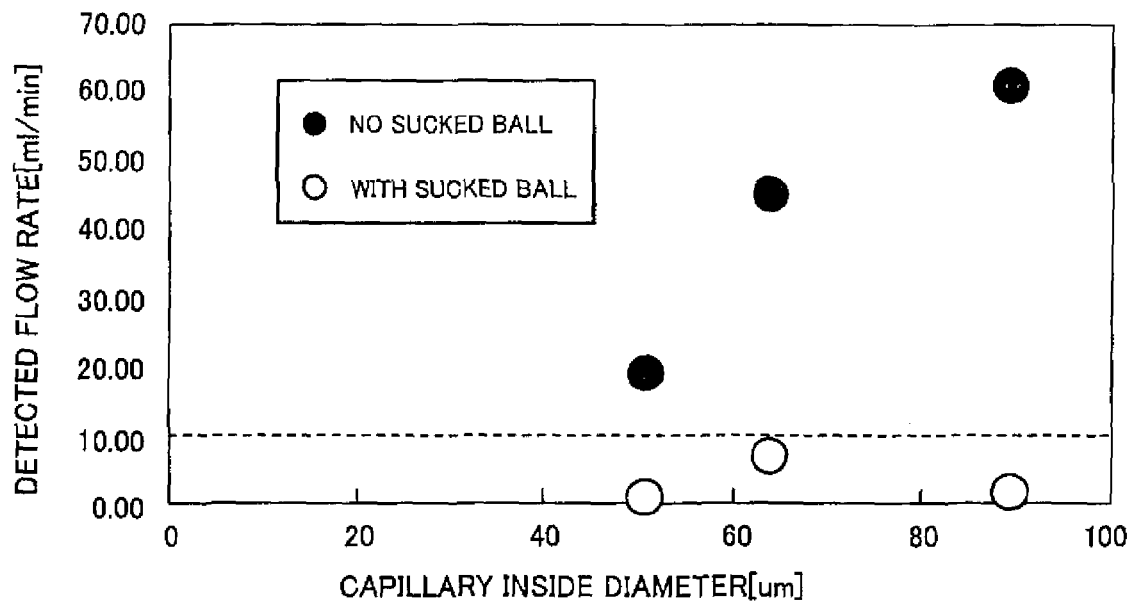
FIG. 3 is a graph showing changes in the flow rate of air flowing in a pipe of a suction mechanism in an experiment conducted with three kinds of capillaries having different inside diameters.

FIG. 3 is a graph showing changes in the flow rate of air flowing in the pipe in the suction mechanism in an experiment conducted with three kinds of capillaries having different inside diameters.

The horizontal axis of the graph shown in FIG. 3 indicates the inside diameter (μm) of the capillary, and the vertical axis shows the flow rate (ml/min) of air flowing in the pipe in the suction mechanism. Plots of solid circles in the graph express the result of the case where a capillary does not suck a solder ball, and plots of blank circles express the result of the case where the capillary sucks a solder ball.

A capillary having an inside diameter of 51 μm, a capillary having an inside diameter of 64 μm, and a capillary having an inside diameter of 89 μm are used in the experiment. As understood from the graph of FIG. 3, irrespective of the capillaries, when the capillary sucks a solder ball, the flow rate of air flowing in the pipe in the suction mechanism becomes lower than that in the case where the capillary does not suck a solder ball. Specifically, with the capillary having any inside diameter, when the capillary does not suck a solder ball, the flow rate of air flowing in the pipe in the suction mechanism is higher than 10 ml/min. When the capillary sucks a solder ball, the flow rate is lower than 10 ml/min. In the solder ball disposing apparatus 1 shown in FIG. 1, therefore, when the measurement value of the flowmeter 1223 of the suction mechanism 122 becomes below 10 ml/min, a signal is sent from the flowmeter 1223 to the controller 25 shown in FIG. 1, and the controller 25 receives the signal and executes the step S4 in FIG. 2.

It is understood from the result of the graph shown in FIG. 3 that the lower limit of the inside diameter of the capillary capable of detecting suction of a solder ball is about 30 μm.

The holding member 111 shown in FIG. 1 and its periphery will now be described in detail.

Figure 4:
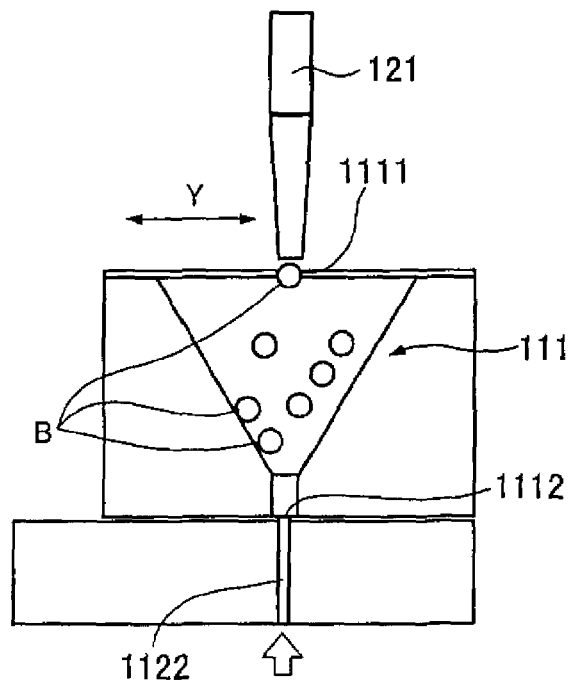
FIG. 4 is a diagram showing a holding member and its periphery illustrated in FIG. 1.

FIG. 4 is a diagram showing the holding member shown in FIG. 1 and its periphery.

FIG. 4 shows a state where air blows upward from the bottom of the holding member 111, solder balls B held in the holding member 111 are blown up by the air, and a solder ball B blown up and reached the supply hole 1111 is sucked by the tip of the capillary 121.

In the bottom of the holding member 111, a round opening 1112 to which the pipe 1122 of the blow-up mechanism is connected is formed. The compressed air passed through the pipe 1122 blows from the round opening 1112 to the inside of the holding member 111. The diameter of the round opening 1112 is 0.08 mm, and the diameter of the part connected to the round opening 1112, of the pipe 1122 is 0.16 mm.

In FIG. 4, the position of the round opening 1112 and the position of the supply hole 1111 in the holding member 111 are aligned in two directions of the X-axis direction (the direction perpendicular to the drawing sheet face of FIG. 4) and the Y-axis direction (the horizontal direction).

The result of an experiment of changing the position of the supply hole 1111 in the holding member 111 in the Y-axis direction will be described. In the experiment, plural solder balls each having a diameter of 0.15 mm are held in the holding member having a round opening (having a diameter of 0.08 mm) in its bottom. The blowout pressure of air is set to 6 kPa, and time is measured ten times each under the same conditions.

Figure 5:
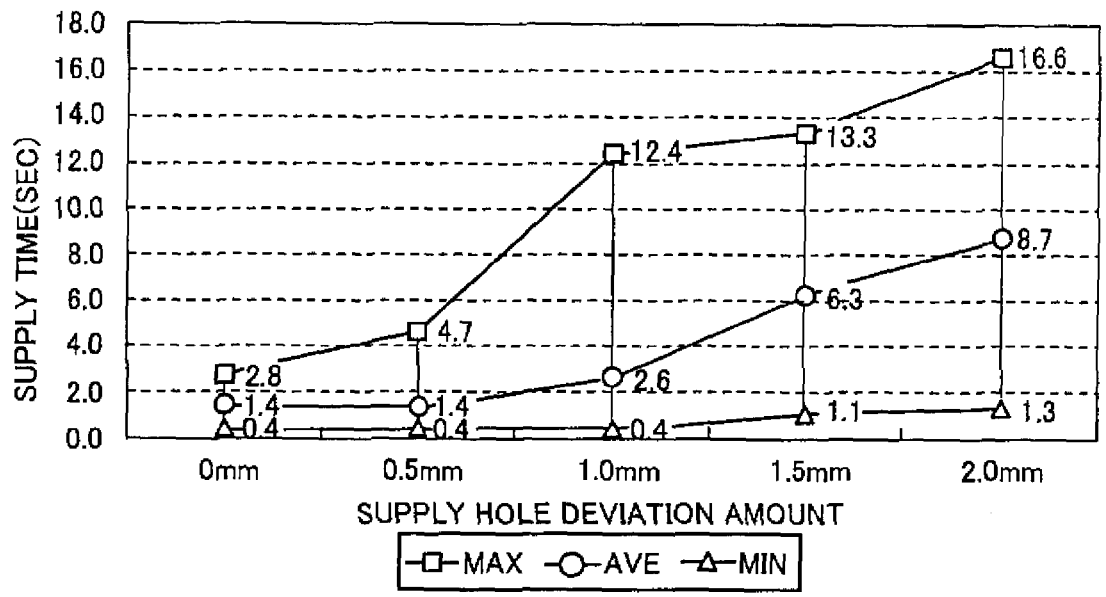
FIG. 5 is a graph showing the relation between the position of a hole in the holding member and time since start of blow-up until a solder ball is sucked in a capillary.

FIG. 5 is a graph showing the relation between the position of the hole in the holding member and time since start of blow-up until a solder ball is sucked in the capillary.

The horizontal axis of the graph shown in FIG. 5 shows an amount of deviation (unit: mm) of the position of the supply hole 1111 in the holding member 111 from the position of the round opening 1112. The vertical axis indicates time (seconds) elapsed since start of blow-up until a solder ball B is sucked by the capillary 121 (hereinbelow, called supply time). The suction of a solder ball B by the capillary 121 is detected by using a change in the flow rate of air flowing in the pipe 1222 in the suction mechanism 122 (hereinbelow, the suction is detected in the same manner). Each of square plots shown in FIG. 5 expresses the longest supply time in ten time measurements. Each of triangle plots expresses the shortest supply time in the ten time measurements. Each of circle plots expresses the average supply time of the ten time measurements. The numerals on the side of the plots express the supply time. As understood from the graph of FIG. 5, with the distance of the position of the supply hole 1111 in the housing member 111 from the position of the round opening 1112, the supply time tends to increase. When the supply time becomes long, the capturing efficiency deteriorates and it is unpreferable. Preferably, the position of the supply hole 1111 in the holding member 111 is aligned to the position of the opening 1112 as much as possible in the Y-axis direction.

The result of the experiment conducted by changing the size of the supply hole 1111 in the holding member 111 will be also described. In the experiment as well, solder balls each having a diameter of 0.15 mm were held in a holding member having a round opening (having a diameter of 0.08 mm) in its bottom, the blowout pressure of air was set to 6 kPa, and the time measurement was performed ten times each under the same conditions.

Figure 6:
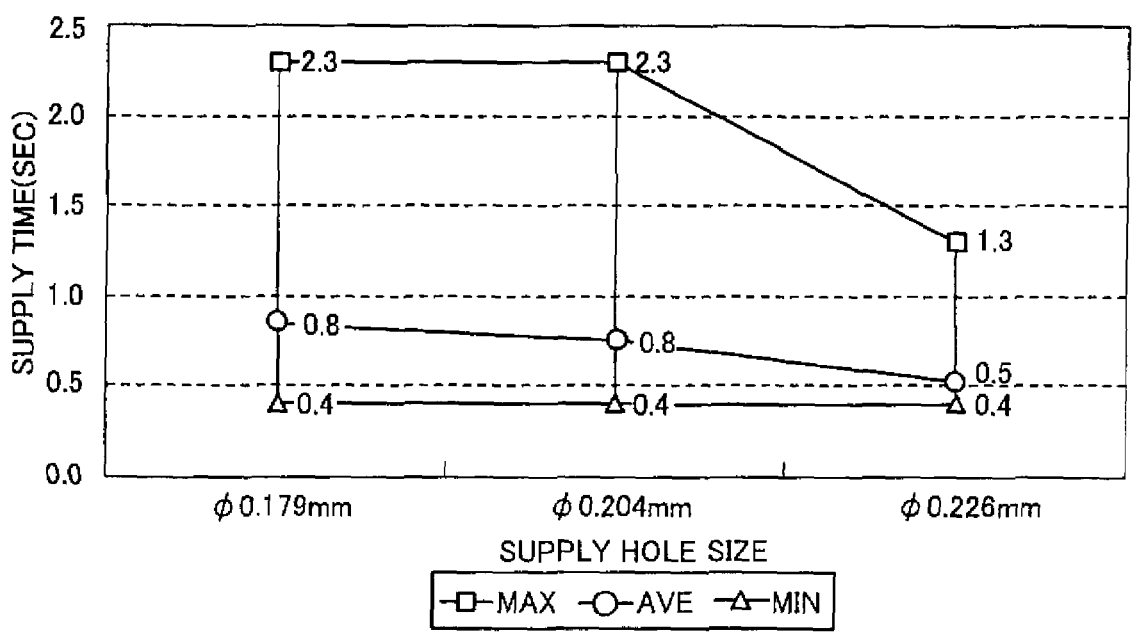
FIG. 6 is a graph showing the relation between the size of a supply hole in the holding member and supply time.

FIG. 6 is a graph showing the relation between the size of the supply hole in the holding member and supply time.

The horizontal axis of the graph shown in FIG. 6 indicates the size (mm) of the supply hole 1111 in the holding member 111, and the vertical axis shows the supply time (seconds). Each of square plots shown in FIG. 6 expresses the longest supply time in ten times of time measurements. Each of triangle plots expresses the shortest supply time in the ten times of time measurements. Each of circle plots expresses the average supply time of the ten times of time measurements. The numerals on the side of the plots express the supply time. As understood from the graph of FIG. 6, when the size of the supply hole 1111 in the housing member 111 is set too large, the supply time becomes long. As a result, the size of the supply hole 1111 in the housing member 111 having the round opening 1112 in its bottom is preferably 120% to 140% of the diameter of a solder ball to be held.

Figure 7:
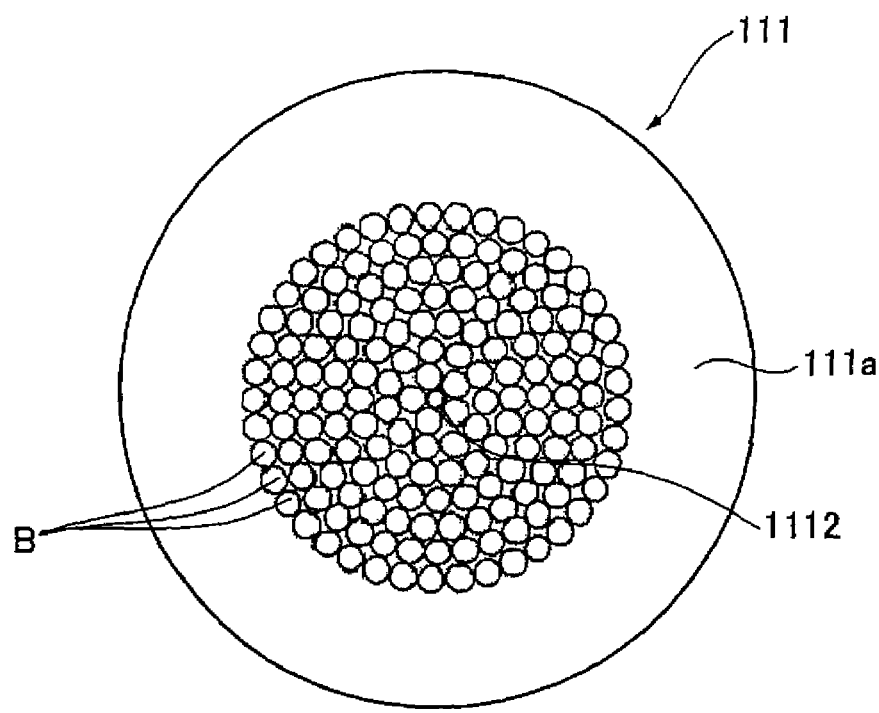
FIG. 7 is a diagram showing a state of the inside of the holding member having a round opening in its bottom.

FIG. 7 is a diagram showing a state of the inside of the holding member having a round opening in its bottom.

FIG. 7 shows a state where air is blown from the round opening 1112 formed in the bottom to blow up the solder balls B and, after that, the blowup of air from the round opening 1112 is stopped. In FIG. 6, the solder balls B are arranged around the round opening 1112 as a center along a wall 111a of the holding member 111 while avoiding the round opening 1112. Immediately after the solder balls B are arranged as shown in FIG. 7, air blown from the round opening 1112 does not come into direct contact with the solder balls B. It takes time for the solder ball B to reach the upper supply hole 1111 (refer to FIG. 4), and the supply time tends to be longer.

Figure 8:
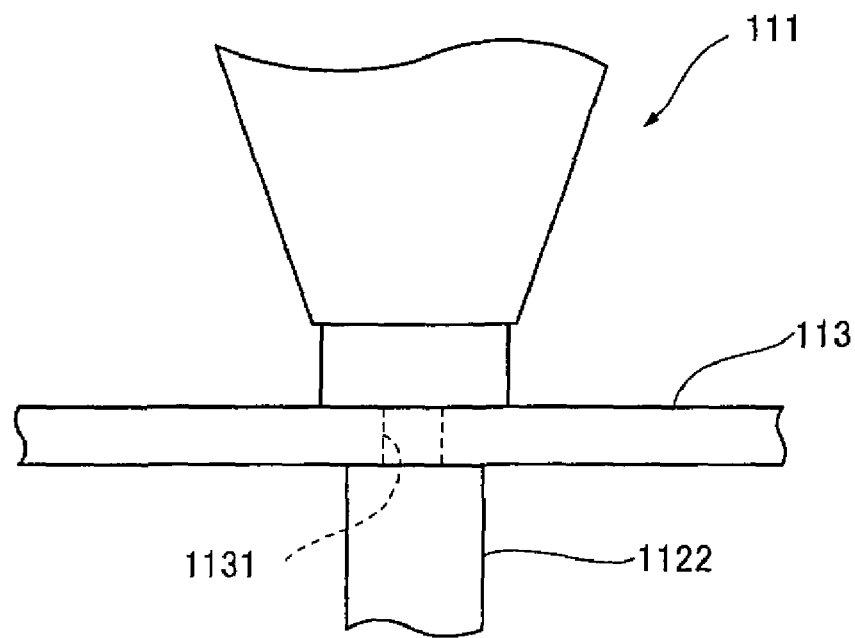
FIG. 8 is a diagram showing an example of forming a slit-shaped opening in the bottom of the holding member.

FIG. 8 is a diagram showing an example of forming a slit-shaped opening in the bottom of the holding member.

Figure 9:
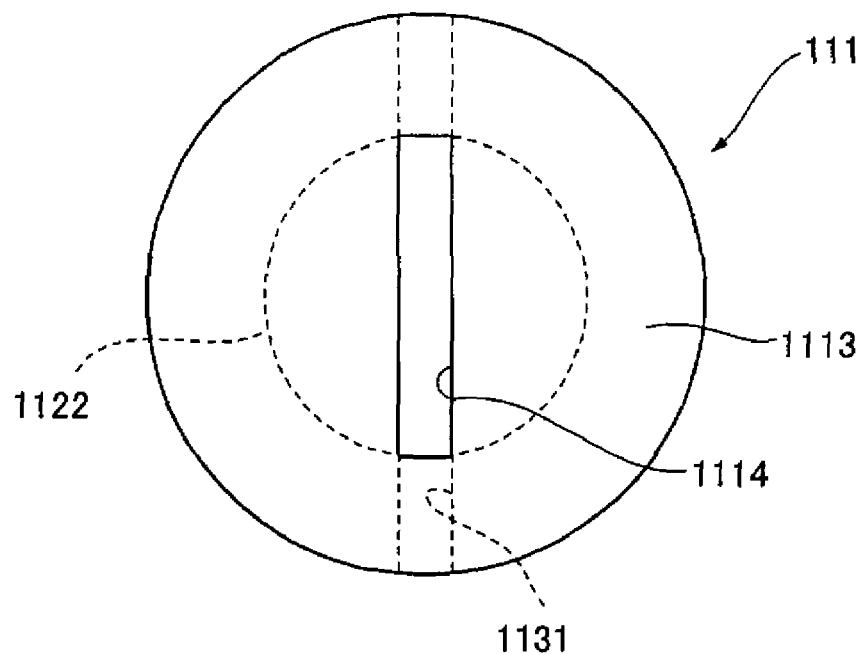
FIG. 9 is a structural diagram viewing the bottom of the holding member shown in FIG. 8 from above.

FIG. 9 is a structural diagram viewing the bottom of the holding member shown in FIG. 8 from above.

In the following description, the same reference numerals will be used for components having the same name as the above-described components.

The housing member 111 and the pipe 1122 in the blowup mechanism are connected to each other via a thin plate member 113. As shown in FIG. 9, a slit-shaped opening 1114 having a length of 0.6 mm and a width of 0.06 mm is formed in a circular bottom 1113 of the holding member 111. A slit 1131 longer than the slit-shaped opening 1114 in the holding member 111 and slightly wider than the opening 1114 is formed in the thin plate member 113. The slit-shaped opening 1114 in the holding member 111 and the slit 1131 in the thin plate member 113 are aligned in the width direction, and air is blown out from the slit-shaped opening 1114 to the inside of the holding member 111. The slit-shaped opening 1114 shown in FIGS. 8 and 9 extends in the X axis direction.

An experiment of changing the position of the supply hole 1111 in the holding member 111 in the Y axis direction and an experiment of changing the size of the supply hole 1111 in the holding member III were conducted on the holding member 111 having the slit-shaped opening 1114 shown in FIGS. 8 and 9 in a manner similar to the experiments conducted on the holding member having the round opening in its bottom. The results of the experiments will be described. The experiments were conducted in a manner similar to the experiments performed on the holding member having the round opening except that the shape of the opening formed in the bottom of the holding member is different. In the holding member 111 having the slit-shaped opening 1114 extending in the X axis direction, even when the position of the supply hole 1111 in the holding member 111 was shifted from the position of the slit-shaped opening 1114 by 2.0 mm in the Y axis direction, the supply time was 0.3 second and unchanged from the supply time of the case where the positions are aligned in the Y axis direction. In the holding member 111 having the slit-shaped opening 1114, even when the size of the supply hole 1111 in the holding member 111 was changed to 0.226 mm, the supply time was 0.3 second and unchanged from the supply time of the case where the size of the supply hole 1111 was 0.179 mm. It was recognized that when the size of the supply hole 1111 in the holding member 111 was 0.226 mm, a solder ball was sucked such that the solder ball was deviated to the tip of the capillary 121. Therefore, also in the holding member 111 having the slit-shaped opening 1114, the size of the supply hole 1111 is preferably 120% to 140% of the diameter of a solder ball to be held.

Figure 10:
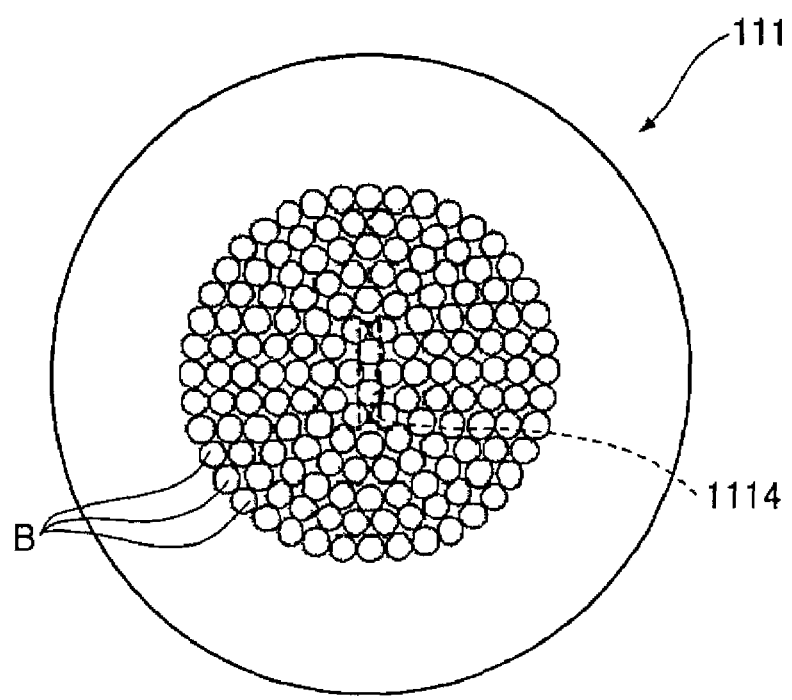
FIG. 10 is a diagram showing a state of the inside of the holding member having a slit opening in its bottom.

FIG. 10 is a diagram showing a state of the inside of the holding member having a slit opening in its bottom.

FIG. 10 shows a state where air is blown from the slit-shaped opening 1114 formed in the bottom to blow up the solder balls B and, after that, the blowup of air from the slit-shaped opening 1114 is stopped. In FIG. 10, the solder balls B exist on the slit-shaped opening 1114 so as to close the opening 1114. When air is blown from the slit-shaped opening 1114 next time, the air comes into direct contact with the solder balls B on the slit-shaped opening 1114. The solder ball B reaches the upper supply hole 1111 (refer to FIG. 4) in a short time, and the capturing efficiency improved.

As described above, the solder ball capturing apparatus 10 assembled in the solder ball disposing apparatus 1 of the embodiment has the simple structure. At low equipment cost, one solder ball can be captured reliably from plural solder balls having the same size.

Although the example using the solder ball having a diameter of 0.15 mm has been described, the invention is not limited to the solder ball but can be applied to various balls. The size of the ball is not also limited. The smaller the ball is, the more the effect of the invention becomes conspicuous.

What is claimed is:

1. A ball capturing apparatus comprising:
   a holding member that includes a hole formed in an upper part of a holding wall of a space that holds a plurality of balls having the same size, the hole being larger than a size of one ball and smaller than a size of two balls;
   a blowup unit to blow the balls held in the holding member upward;
   a capturing unit to capture a ball blown up by the blowup unit and reached the hole, the capturing unit and the holding member together provide an air-tight closing of the space; and
   a drawing unit to draw the balls held in the space to a lower place through sucking air in the space by a pump while an operation of the blowup unit stops.

2. The ball capturing apparatus according to claim 1, wherein the blowup unit blows out fluid from a slit-shaped opening into the holding member.

3. The ball capturing apparatus according to claim 1, wherein the blowup unit blows fluid into the holding member, and comprises:
   a passage in which the fluid flows; and
   a depressure unit, provided in the passage, for making a part of pressure in the passage escape to an outside of the passage.

4. The ball capturing apparatus according to claim 1, wherein the capturing unit captures the ball that reached the hole by suction.

5. The ball capturing apparatus according to claim 4, wherein the capturing unit has a passage in which sucked air flows and a flowmeter that measures flow rate of the air flowing in the passage, and
   the ball capturing apparatus further comprises a detector that detects that the capturing unit captures the ball in accordance with a change in the flow rate measured by the flowmeter.

6. A solder ball disposing apparatus that disposes a solder ball containing solder in a predetermined position on a circuit board, the solder ball disposing apparatus comprising:
   a holding member in which a hole is formed in an upper part of a holding wall of a space that holds a plurality of solder balls having the same size, the hole being larger than a size of one solder ball and smaller than a size of two solder balls;
   a blowup unit to blow the solder balls held in the holding member upward;
   a capturing unit to capture a solder ball blown up by the blowup unit and reached the hole, the capturing unit and the holding member together provide an air-tight closing of the space;
   a drawing unit to draw the balls held in the space to a lower place through sucking air in the space by a pump while an operation of the blowup unit stops; and
   a disposing mechanism that aligns position of the solder ball captured by the capturing unit with the predetermined position in the circuit board and disposes the solder ball in the predetermined position.

7. The solder ball disposing apparatus according to claim 6, wherein the blowup unit blows out fluid from a slit-shaped opening into the holding member.

8. The solder ball disposing apparatus according to claim 6, wherein the blowup unit blows fluid into the holding member, and comprises:
   a passage in which the fluid flows; and
   a depressure unit, provided in some midpoint of the passage, for making a part of pressure in the passage escape to the outside.

9. The solder ball disposing apparatus according to claim 6, wherein the capturing unit captures the solder ball that reached the hole by suction.

10. The solder ball disposing apparatus according to claim 9, wherein the capturing unit has a passage in which sucked air flows and a flowmeter that measures flow rate of the air flowing in the passage, and
    the solder ball disposing apparatus further comprises a detector that detects that the capturing unit captures the solder ball in accordance with a change in the flow rate measured by the flowmeter.

11. A ball capturing method comprising:
    aligning a capturing unit, which operates to capture a ball, with a hole formed in an upper part of a holding wall of a space that holds a plurality of balls having the same size, the hole being larger than a size of one ball and smaller than a size of two balls, the capturing unit and the holding wall together provide an air-tight closing of the space;
    blowing the balls held in the holding member upward and capturing a ball blown up and reached the hole by the capturing unit;
    stopping blowup of the balls; and
    drawing the balls to a lower place through sucking air in the space by a pump.

12. The ball capturing method according to claim 11, wherein the blowing includes blowing up the balls held in the space by blowing fluid from a slit-shaped opening into the space.

13. A ball capturing method comprising:
    aligning a capturing unit, which operates to capture a ball by suction, with a hole formed in an upper part of a holding wall of a space that holds a plurality of balls having the same size, the hole being larger than a size of one ball and smaller than a size of two balls, the capturing unit and the holding wall together provide an air-tight closing of the space;
    starting sucking operation of the capturing unit aligned with the hole;
    blowing up the balls held in the space and sucking and capturing a ball blown up and reached the hole by the capturing unit; and
    stopping blowup of the balls and drawing the balls to a lower place through sucking air in the space by a pump by a suction force weaker than a suction force of the capturing unit.

14. The ball capturing method according to claim 13, wherein the stopping includes stopping the blowup of the balls when flow rate of air in a passage in which the air sucked by the capturing unit flows becomes lower than predetermined flow rate.

15. A solder ball disposing method of disposing a solder ball containing solder in a predetermined position on a circuit board, the solder ball disposing method comprising:

aligning a capturing unit, which operates to capture a solder ball by suction, with a hole formed in an upper part of a holding wall of a space that holds a plurality of solder balls having the same size, the hole being larger than a size of one solder ball and smaller than a size of two solder balls, the capturing unit and the holding wall together provide an air-tight closing of the space;

blowing up the solder balls held in the space and capturing a solder ball blown up and reached the hole by the capturing unit;

stopping blowup of the balls and drawing the balls to a lower place through sucking air in the space by a pump; and disposing the solder ball captured by the capturing unit in the predetermined position on the circuit board.

16. The solder ball disposing method according to claim 15, wherein the blowing includes blowing up the solder balls held in the space by blowing fluid from a slit-shaped opening into the space.

17. A solder ball disposing method of disposing a solder ball containing solder in a predetermined position on a circuit board, the solder ball disposing method comprising:

aligning a capturing unit, which operates to capture a ball, with a hole formed in an upper part of a holding wall of a space that holds a plurality of balls having the same size, the hole being larger than a size of one ball and smaller than a size of two balls, the capturing unit and the holding wall together provide an air-tight closing of the space;

starting sucking operation of the capturing means aligned with the hole;

blowing up the solder balls held in the space and sucking and capturing a solder ball blown up and reached the hole by the capturing means;

stopping blowup of the balls and drawing the balls to a lower place through sucking air in the space by a pump by a suction force weaker than a suction force of the capturing unit; and aligning position of the solder ball captured by the capturing unit with the predetermined position on the circuit board, and then, stopping the sucking operation of the capturing unit and disposing the solder ball captured by the capturing unit to the predetermined position.

18. The solder ball disposing method according to claim 17, wherein aligning the position of the solder ball is executed after the stopping is performed.

19. The ball capturing method according to claim 17, wherein the stopping includes stopping blowup of the solder balls when flow rate of air in a passage in which a flow of the air sucked by the capturing unit becomes lower than a predetermined flow rate.

* * * * *